US005105116A

United States Patent [19]

[11] Patent Number: 5,105,116

[45] Date of Patent: Apr. 14, 1992

Okamoto et al.

[54] PIEZOELECTRIC TRANSDUCER AND SOUND-GENERATING DEVICE

[75] Inventors: Shinichi Okamoto; Hirokazu Ono; Masanori Fujita, all of Tokyo, Japan

[73] Assignee: Seikosha Co., Ltd., Tokyo, Japan

[21] Appl. No.: 530,685

[22] Filed: May 30, 1990

[30] Foreign Application Priority Data

May 31, 1989 [JP] Japan ................................ 1-138516
Jun. 15, 1989 [JP] Japan ................................ 1-152523

[51] Int. Cl.⁵ ............................................ H01L 41/08

[52] U.S. Cl. .................................... 310/311; 310/324; 310/338; 310/357; 310/364

[58] Field of Search ............... 310/311, 322, 324, 328, 310/338, 339, 364, 357, 358; 350/350 S

[56] References Cited

U.S. PATENT DOCUMENTS 3,761,956 9/1973 Takahashi et al. .................. 310/324
3,970,879 7/1976 Kumon ................................ 310/324
4,869,577 9/1989 Masaki .............................. 350/350 S
4,875,378 10/1989 Yamazaki et al. .............. 310/338 X

*Primary Examiner*—Mark O. Budd
*Attorney, Agent, or Firm*—Jordan and Hamburg

[57] ABSTRACT

A piezoelectric transducer useful for example as a sound source or a strain detector includes a ferroelectric liquid crystal sealed between two baseplates with electrodes and alignment layers on the inner facing surfaces of the baseplates. One of the baseplates is thicker than the other, or is of a different material, so that the two baseplates have different flexural rigidity.

6 Claims, 5 Drawing Sheets

(a)

(b)

PIEZOELECTRIC TRANSDUCER AND SOUND-GENERATING DEVICE

FIELD OF THE INVENTION

The present invention relates to a piezoelectric transducer and a sound-generating device.

BACKGROUND OF THE INVENTION

Some known piezoelectric devices are made from ceramics such as PZT (solid solution of lead titanate ($PbTiO_3$) and lead zirconate ($PbZrO_3$)) Other known piezoelectric devices are made from high-molecular materials such as PVDF (polyvinylidene fluoride). These piezoelectric devices find extensive use as devices for generating sound from the audible range to the ultrasonic range, as electromechanical transducers such as actuators and motors, and as mechano-electrical transducers such as pressure sensors.

A conventional sound-generating device comprises a vibration source such as the above-noted piezoelectric device and a Helmholz resonance box. Vibration of the vibration source is resonated by the resonance box to generate large sound which is emanated from a hole of the resonance box.

Piezoelectric devices made from ceramic materials must be sintered at high temperatures of about 1000°-1500° C., and therefore it is difficult to obtain dimensional accuracy. Also, ceramic materials are very brittle and so they break easily. For piezoelectric devices made from high-molecular materials, high-molecular materials formed in a film-like shape are mechanically stretched. So that, it is difficult to obtain dimensional accuracy. Known piezoelectric devices must be subjected to poling process, in which a high DC electric field is applied at Curie temperatures or above, and then they are cooled below Curie temperatures to align the electric dipoles, in order to develop piezoelectric property. Thus, the manufacturing processes are troublesome.

As for the prior art sound-generating devices using such piezoelectric devices that employ resonance boxes, it is difficult to fabricate them in small sizes. Especially, it is difficult to make them thin. Since sound emanates from a hole formed in a resonance box, sound propagates in only certain directions. Thus, it has been impossible to emanate sound in every direction. Further, limitations are imposed on the degree of freedom given to the shape. This makes it difficult to produce loud sound.

SUMMARY OF THE INVENTION

Accordingly, it is an object of the present invention to provide a totally novel piezoelectric transducer which does not always need a poling process in its fabrication and can be displaced to a great extent, and develop a largerelectromotive force than heretofore possible. It is another object of the invention to provide a sound-generating device which has a high acoustical transducing efficiency, and generates loud sound, using this piezoelectrical transducer.

The above objects are achieved by providing a piezoelectric transducer comprising a ferroelectric liquid-crystal panel consisting of two baseplates and a ferroelectric liquid crystal sealed between said two baseplates, the facing inner surfaces of the baseplates having electrodes and alignment layers, the flexural rigidity of one of the baseplates being smaller than that of the other.

Making the thicknesses or the materials of the two baseplates different is effective in making the flexural rigidity of one baseplate smaller than that of the other.

Using this piezoelectric transducer, a sound-generating device comprising an acoustic reflex plate mounted substantially parallel to a liquid-crystal panel can be fabricated. The acoustic reflex plate makes a space forming a resonance system when the liquid-crystal panel is vibrated by the electrostrictive effect of a ferroelectric liquid crystal. This sound-generating device can be designed so that sound emanates from substantially the whole outer periphery of the acoustic reflex plate.

Using this piezoelectric transducer, an electromechanical transducer can be fabricated in which a voltage-detecting means detects the potential developed between the electrodes, corresponding to the strain exerted to the baseplates.

BRIEF DESCRIPTION OF THE DRAWINGS

In order that the invention may be more clearly understood, it will now be disclosed in greater detail with reference to the following drawings, wherein.

DESCRIPTION OF THE PREFERRED EMBODIMENTS

Figure 1:
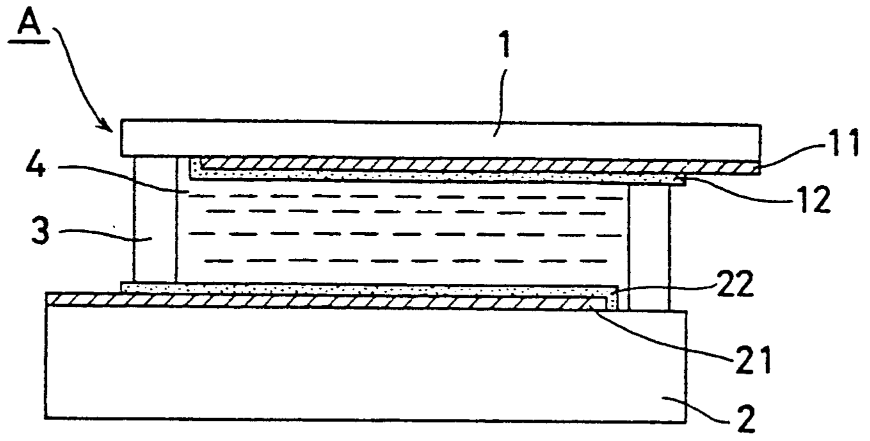
FIG. 1 is a schematic elevation of a piezoelectric transducer according to the invention.

Referring to FIG. 1, therein is shown a ferroelectric liquid-crystal panel according to the invention. The panel is indicated by A. Two baseplates 1 and 2 are disposed opposite to each other. The flexural rigidity of one of the baseplates is smaller than that of the other. The two baseplates are made of glass and are different in thickness. The baseplate 1 is thinner than the other plate 2, so that it has smaller flexural rigidity. Electrodes 11, 21 and alignment layers 12, 22 are formed on the facing inner surfaces of the two baseplates 1 and 2. The electrodes 11 and 21 have conductivity and are made from ITO (indium tin oxide), Al (aluminum), Cr (chromium), Ni (nickel), or other material. The alignment layers 12 and 22 consist of a matrix of an organic material, such as polyimide, polyvinyl alcohol, polyamide, Teflon, or an acrylic resin, or an inorganic material, such as $SiO_2$ or $Al_2O_3$. The other peripheries of the baseplates 1 and 2 are sealed by a sealant 3 to maintain a gap between them. A ferroelectric liquid crystal 4 is sealed in this gap.

Figure 2:
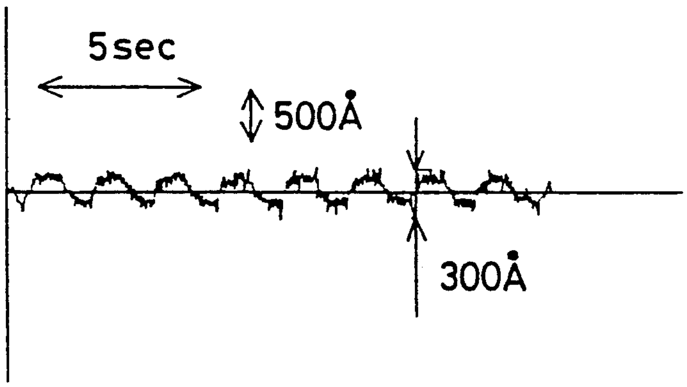
FIGS. 2(a) and 2(b) are graphs showing the surface displacement characteristics of a piezoelectric transducer according to the invention and the prior art piezoelectric transducer when they are vibrated.
Figure 2:
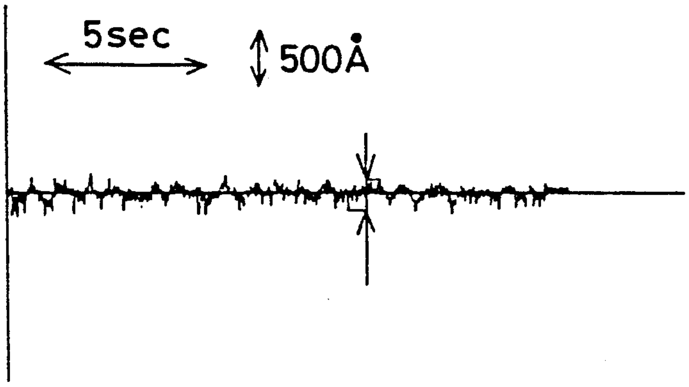

FIGS. 2(a) and 2(b) are graphs showing the characteristics obtained by measuring the surface displacement of the two ferroelectric liquid-crystal panels. Novel liquid crystal panel A comprises the two baseplates 1 and 2 having different flexural rigidities. A prior art ferroelectric liquid-crystal panel comprises two baseplates having equal flexural rigidity. These two panels were built under the following conditions. AC voltages were applied to the electrodes of the panels. The panels were vibrated by the electrostrictive effect of the ferroelectric liquid crystals.

| | novel panel | prior art panel |
|---|---|---|
| size: | 60 mm × 80 mm | 60 mm × 80 mm |
| material: | glass | glass |
| thickness of baseplate 1: | 0.5 mm | 1.1 mm |
| thickness of baseplate 2: | 1.8 mm | 1.1 mm |

| | |
|---|---|
| orientating method: | Polyimide was baked after spin coating, so that the alignment layers were formed on the electrodes. The alignment layers were oriented by rubbing, and then the baseplates were so combined that the directions of rubbing on the two baseplates formed an angle of 100°. The peripheries of the baseplates were sealed to keep a space of 10μ between the electrodes. A ferroelectric liquid crystal was injected between the baseplates under vacuum. The assembly was heated until it reached isotropic phase and it was gradually cooled to room temperature to align the alignment layer. |
| liquid crystal: | ZLI-3774 manufactured by Merck Co., Ltd. |
| measuring method: | AC voltage of ± 100 V and 0.5 Hz was applied to the electrodes 11 and 21. The displacement at the center of each panel was measured with a surface roughness tester. (Surfcom 555A by Tokyo Seimitsu Co., Ltd.) |

Measurements were made under the above conditions. The results of measurement on the novel liquid-crystal panel A are shown in FIG. 2(a). According to this graph, the difference between the maximum and the minimum of the displacement of the panel was 300 Å, when an AC voltage of +100 V liquid-crystal was applied.

The results of measurement made on the prior art liquid-crystal panel are shown in FIG. 2(b). Although the panel vibrated quite slightly, peaks of displacement could not be observed clearly, and they were indistinguishable from noise.

AC voltage of ±15 V was applied to these two liquid-crystal panels while shifting the frequency. Both of the two panels showed resonance frequencies about 4 KHz. The novel liquid-crystal panel generated much greater sound than the conventional liquid-crystal panel.

As for ferroelectric liquid-crystal panels having the same size and the same thickness, it was clear that a ferroelectric liquid-crystal panel comprising two baseplates having different flexural rigidities generates greater vibration and greater sound than a ferroelectric liquid-crystal panel comprising baseplates having the same flexural rigidity.

Figure 3:
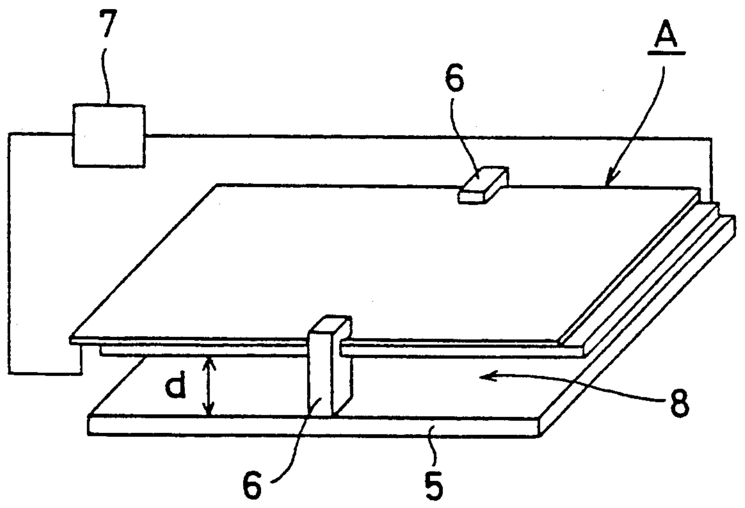
FIG. 3 is a perspective view of a sound-generating device according to the invention.

FIG. 3 shows a sound-generating device using a ferroelectric liquid-crystal panel A according to the invention. An acoustic reflex panel 5 is mounted substantially parallel to the panel by two support poles 6 such that a space d is provided between them. The reflex plate 5 forms the space d constituting a resonance system for vibration of the liquid-crystal panel. An electric signal generating means 7 applies a driving signal to both electrodes of the panel A.

In the present example, since the acoustic reflex plate is fixed by the two support poles 6, almost all of the periphery of the space 8 between the ferroelectric liquid-crystal panel A and the acoustic reflex plate 5 is open except for the positions of the poles 6. An AC voltage of a proper frequency is applied to electrodes 11 and 21, so that the panel A vibrates by the electrostrictive effect of the ferroelectric liquid-crystal panel 4. The vibration of the panel A is resonated by the space 8 forming the resonance system, to generate large sound. The sound emanates from almost all of the outer periphery of the acoustic reflex plate 5.

When sound pressure was measured, the novel ferroelectric liquid-crystal panel and the prior art ferroelectric liquidcrystal panel described above each utilized acoustic reflex plates. In this way, two sound-generating devices were fabricated. The space d of 3.5 mm was formed between the liquid-crystal panel and the acoustic reflex plate; therefore a resonance system of sound at 4 KHz was formed. AC voltage of ±15 V supplied from the electrical signal-generating means 7 was applied to the sound generating device while shifting the frequency. As a result, sound pressure-frequency characteristics shown in FIG. 4 were obtained.

Figure 4:
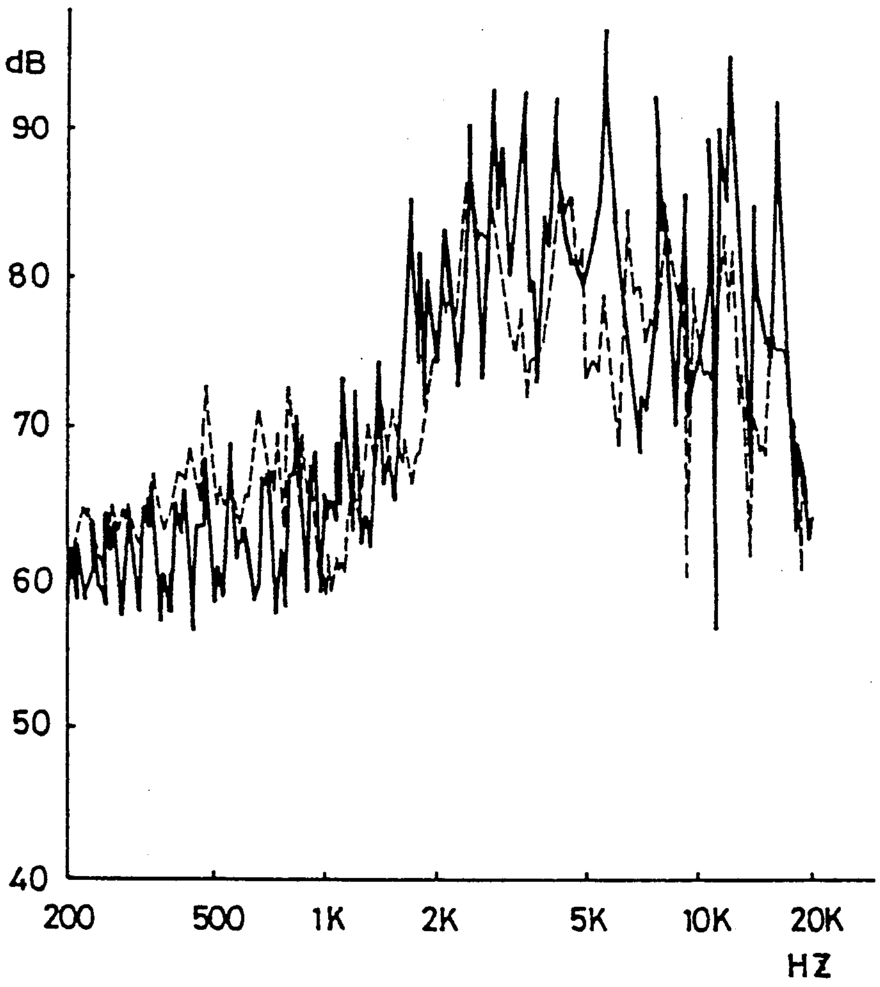
FIG. 4 is a graph showing the sound pressure-frequency characteristics of sound-generating devices using a novel piezoelectric transducer and the prior art piezoelectric transducer.

In FIG. 4, the solid lines indicate the characteristics of the novel panel, and the broken lines indicate the characteristics of the prior art panel. In any case, sound pressure exceeded 80 dB at frequencies over 4 KHz. It can be seen that the novel panel generated much greater sound in a frequency range over 1 Khz, which is used as an alarm.

Next, in this sound-generating device, the baseplate 1 of smaller flexural rigidity of the ferroelectric liquid-crystal A was disposed on the side of the acoustic reflex plate 5 formingresonance system, in contrast with the device shown in FIG. 3; it generated the comparable sound pressure. It can be seen from this fact that smaller flexural rigidity of one of the two baseplates 1 and 2 permits the novel sound-generating device to produce larger sound and that the position of the baseplate 1 having smaller flexural rigidity is not always related to the generation of larger sound.

Figure 5:
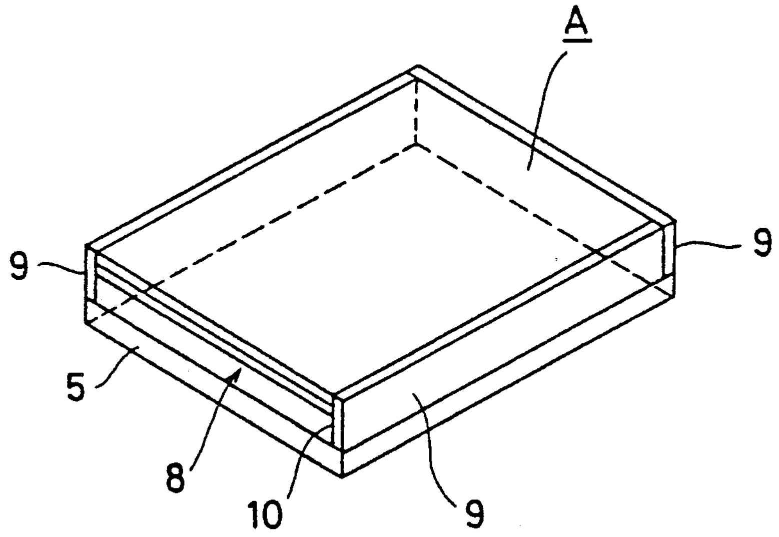
FIG. 5 is a perspective view of another sound-generating device according to the invention.

FIG. 5 shows another means for affixing the acoustic reflex plate 5 to the ferroelectric liquid-crystal panel A. A peripheral wall plate 9 is fixed to three sides of the reflex plate 5 to maintain the space d. The ferroelectric liquid-crystal panel A is fixed to the upper end of the peripheral wall plate 9. In this example, three sides of a space 8 forming a resonance system are surrounded by the peripheral wall plate 9. Only the front side forms an opening 10 from which sound is emanated.

Figure 6:
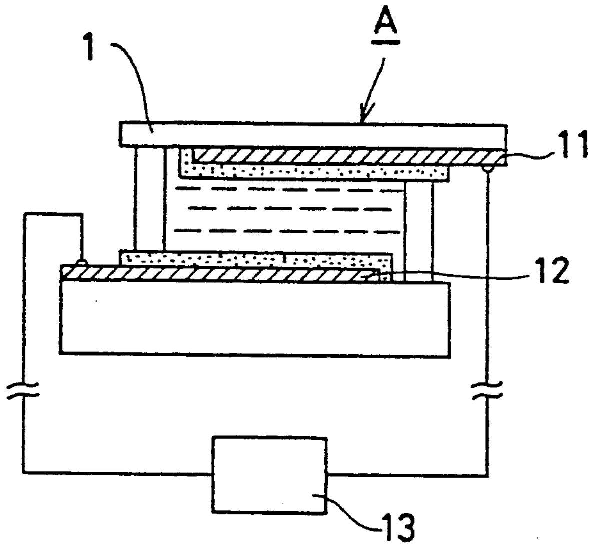
FIG. 6 is a schematic elevation of an electromechanical transducer according to the invention.

FIG. 6 shows an electromechanical transducer using the novel ferroelectric liquid-crystal panel A shown in FIG. 1. A voltage-detecting means 13 is connected between electrodes 11 and 21 to detect voltage developed between the electrodes 11 and 21, corresponding to strains exerted to the baseplates 1 and 2 of the above-described liquid-crystal panel.

Figure 7:
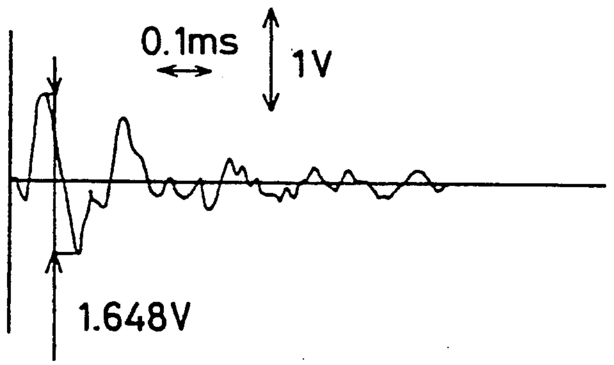
FIG. 7 is a graph showing the electromotive characteristics of the electromechanical transducer.

In order to examine the electromotive effect of the electromechanical transducer constructed as described above, a ball of 7g was dropped from a height of 5 cm to apply a force to the ferroelectric liquid-crystal panel A. The voltage-detecting means 13 detected a large electomotive force produced by collision of the ball and the force gradually attenuated, as shown in FIG. 7. When a ball of 7g was dropped from a height of 5 cm, the difference between the maximum and the minimum of the voltage developed across the ferroelectric liquid-crystal panel A was 1.648 V.

Adapting the electromechanical transducer, a touch-switch device can be fabricated. In this case, the electromotive force produced by the depression of the surface of the ferroelectric liquid-crystal panel A is detected at the time of depression. When the novel electromechanical transducer is employed in a keyboard or other device needing a number of switches, numerous electrodes are formed by photoetching or other process, and then a number of switches having uniform characteristics can be formed easily and simultaneously out of a single ferroelectric liquid-crystal panel. Further, a large output can be obtained by using two baseplates which have flexural rigidities.

It is not always necessary that the two baseplates be made from the same material. They may be made from different materials such that they have different flexural rigidities. For example, one baseplate may be a flexible plate.

The invention is not limited to the arrangement in which the alignment layers 12 and 22 make an angle of 100 degrees to each other. The layers may have a parallel or anti-parallel relation to each other. Only one side may be oriented by rubbing. Preferably, the alignment layers are oriented to the homogeneous alignment.

As described thus far, the novel piezoelectric transducer is made of a ferroelectric liquid-crystal panel and, therefore, it is easy to shape the transducer into any desired form. In addition, a poling process is not always needed. Since the flexural rigidity of the two baseplates is different, a larger amount of displacement is obtained than heretofore. Further, a larger electromotive force is generated for a certain mechanical force. Hence, the transducer has an eminent electromotive effect. The novel sound-generating device develops large sound pressure. When an acoustic reflex plate is mounted to this sound-generating device, the acoustical transducing efficiency is enhanced and louder sound can be generated. Also, the electric power consumed can be reduced. The device is simple in structure and easy to fabricate. The sound-generating device can be thin. By forming a space constituting a resonance system in such a way that all the sides of the space are open, sound can be generated from the entire outer periphery.

Although the present invention has been described through specific terms, it should be noted here that the described embodiments are not necessarily exclusive and that various changes and modifications may be imparted thereto without departing from the scope of the invention, which is limited solely by the appended claims.

What we claim is:

1. A sound-generating device comprising a piezoelectric transducer comprised of a ferroelectric liquid-crystal panel having two baseplates and a ferroelectric liquid crystal sealed between said two baseplates and wherein the facing inner surfaces of the baseplates have electrodes and alignment layers and one of the baseplates has a smaller flexural rigidity than that of the other baseplate, and an acoustic reflex plate making a space that forms a resonance system for vibration of the liquid-crystal panel caused by the electrostrictive effect of the ferroelectric liquid crystal mounted substantially parallel to the liquid-crystal panel.

2. A sound-generating device according to claim 1, wherein sound emanates from substantially the whole outer periphery of the acoustic reflex plate.

3. A piezoelectric transducer comprising a ferroelectric liquid-crystal panel comprising first and second baseplates having facing inner surfaces, a ferroelectric liquid crystal sealed between said two baseplates, first and second electrodes on said facing inner surfaces of the first and second baseplates, respectively, alignment layers on the electrodes, said first baseplate having a smaller flexural rigidity than said second baseplate, and means for applying an alternating voltage between said first and second electrodes of sufficient magnitude to vibrate said baseplates.

4. The piezoelectric transducer of claim 3 wherein said first and second baseplates are of a different material, whereby their differences in flexural rigidity is produced by the differences in their respective materials.

5. The piezoelectric transducer of claim 3 wherein said first baseplate comprises a flexible plate.

6. The piezoelectric transducer of claim 3 wherein said first and second baseplates are of a different thickness, whereby their difference in flexural rigidity is produced by the differences in their respective thicknesses.

* * * * *